(12) United States Patent
Mueller et al.

(10) Patent No.: US 6,320,780 B1
(45) Date of Patent: Nov. 20, 2001

(54) REDUCED IMPACT FROM COUPLING NOISE IN DIAGONAL BITLINE ARCHITECTURES

(75) Inventors: Gerhard Mueller; Ulrike Gruening, both of Wappingers Falls, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/406,892

(22) Filed: Sep. 28, 1999

(51) Int. Cl.[7] ....................................... G11C 5/06
(52) U.S. Cl. ......................... 365/63; 365/189.08
(58) Field of Search .................. 365/63, 230.03, 365/230.06, 189.08

(56) References Cited

U.S. PATENT DOCUMENTS 5,901,105 * 5/1999 Ong et al. ...................... 365/230.06

* cited by examiner

Primary Examiner—David Nelms
Assistant Examiner—M. Tran (57) ABSTRACT

An integrated circuit comprising first and second adjacent signal line pairs 310 and 320 is described. The signal line pairs comprise diagonal signal paths 311p, 312p; 321p and 322p with directional changes 335. The first signal line pair comprises m twists 340, where m is a whole number $\geq 1$, and the second signal line pair comprises n twists 360 and 361, where n is a whole number $\neq$ m.

21 Claims, 8 Drawing Sheets

REDUCED IMPACT FROM COUPLING NOISE IN DIAGONAL BITLINE ARCHITECTURES

FIELD OF THE INVENTION

The present invention relates generally to reducing the adverse impact of coupling noise in signal lines of, for example, an integrated circuit (IC). In particular, the invention relates to bitline architectures which reduce the impact of coupling noise to improve sensing of memory cells.

BACKGROUND OF THE INVENTION

Figure 1:
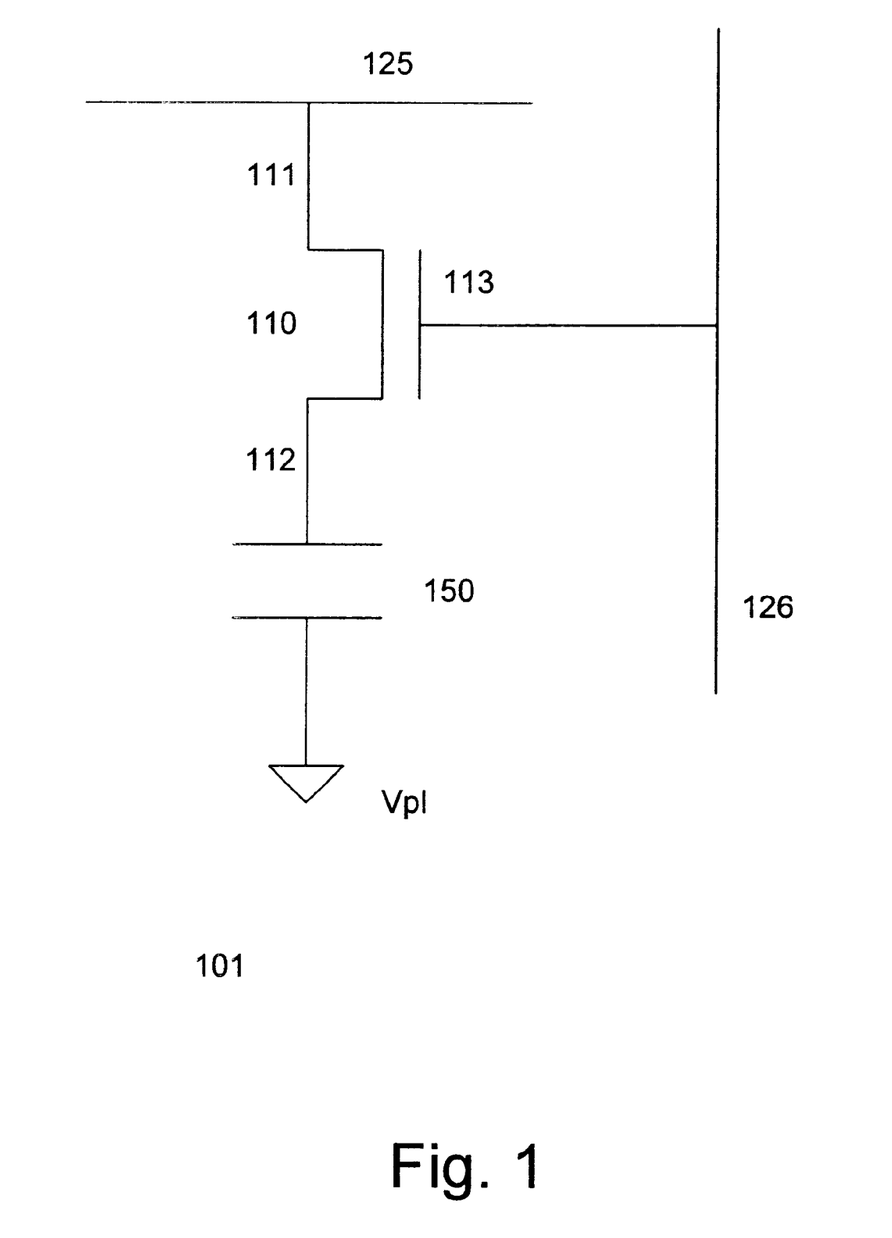
FIG. 1 shows a memory cell.

Referring to FIG. 1, a conventional dynamic random access memory cell 101 is shown. As shown, the memory cell comprises a cell transistor 110 and a cell capacitor 150 for storing information. A first junction 111 of the transistor is coupled to a bitline 125, and a second junction 112 is coupled to the capacitor 150. A gate electrode 113 of the transistor is coupled to a wordline 126. A reference or constant voltage ($V_{pl}$) can be coupled to a plate of the capacitor. The plate which is coupled to the reference voltage can serve as a common plate in the memory array.

Cells are arranged in rows and columns to form an array, connected by wordlines in the row direction and bitlines in the column direction. The bitlines are coupled to sense amplifiers to facilitate memory accesses. Typically, a pair of bitlines is coupled to a sense amplifier. The bitline containing the selected memory cell is referred to as the bitline or bitline true and the other is referred to as the reference bitline or bitline complement.

The bitlines can be arranged in various types of bitline architectures, such as open, folded, open-folded, diagonal, multi-level, split-level, or split-level diagonal. Multi-level or split-level bitline architectures are described in, for example, Hamada et al., A Split Level Diagonal Bitline Stack Capacitor Cell for 256 Mb DRAMs, IEDM 92-7990, which is herein incorporated by reference for all purposes.

Figure 2:
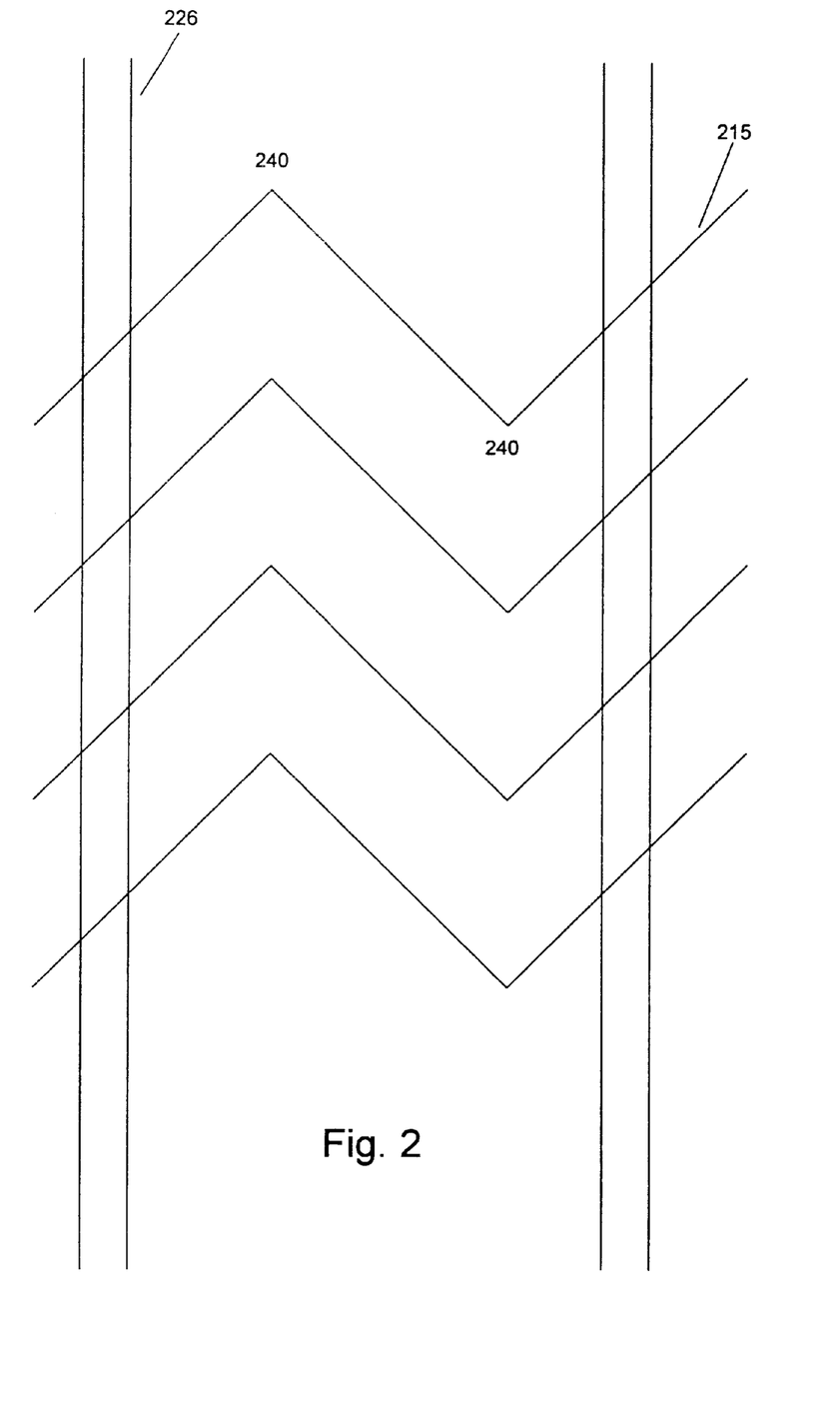
FIG. 2 shows diagonal bitlines.

FIG. 2 shows a conventional diagonal bitline architecture. As shown, bitlines 215 are arranged diagonally with respect to wordlines 226. The bitlines include directional changes 240, which change the angle of the bitlines with respect to the wordlines.

A memory access typically comprises precharging the bitlines to a predefined voltage level (e.g., equalization voltage or $V_{bleq}$). A memory cell within a bitline pair is selected after the bitlines are precharged and floated. The memory cell is selected by rendering the transistor of the memory cell conductive, coupling the memory cell's capacitor to the bitline true. Depending on the value stored in the capacitor, the bitline true is pulled above or below $V_{bleq}$. The reference bitline, in the ideal case, remains at $V_{bleq}$. The voltage difference between the reference bitline and bitline true is the differential voltage. A sense amplifier coupled to the bitline pair senses and amplifies the differential voltage signal, which is indicative of the data stored in the selected memory cell.

An important issue to consider in designing memory ICs is to provide an adequate sensing signal (i.e., differential voltage) to the sense amplifier in order for the data to be read accurately from memory. The differential signal sensed by a sense amplifier, in an ideal situation, depends on the charge sharing between the bitline and the memory cell being accessed. The ratio of the bitline capacitance (and the capacitance of the sense amplifier) to the cell capacitance determines the magnitude of the differential signal.

However, the voltage of the reference bitline increases or decreases along with the voltage swing on the bitline true due to coupling noise between the bitlines of the bitline pair (intra-bitline coupling), thereby decreasing the magnitude of the differential signal or signal margin. For example, substantial coupling noise between the bitline and reference bitline in a diagonal bitline architecture causes a decrease in the signal margin of the differential signal. A reduction in the signal margin of the differential signal is undesirable as this may lead to incorrect evaluation of the data stored in the memory cell.

In addition, coupling noise from neighboring bitline pairs (inter-bitline coupling) can also reduce the signal margin. The sense amplifiers of the array may not be activated simultaneously. This occurs because of, for example, different amplification speeds for a "0" and a "1", difference in the threshold voltage of the various latch transistors, or a skew in the activation of the sense amplifiers in the top and bottom bank in an interleaved arrangement. Coupling noise from a bitline pair whose differential signal is amplified can reduce the differential signal of a neighboring bitline pair whose differential signal has yet to be amplified.

The problems associated with coupling noise become worse as ground rules become smaller. This is because the fraction bitline-to-bitline capacitance contribution to the total bitline capacitance increases with decreasing device dimensions.

As evidenced from the foregoing discussion, it is desirable to reduce the impact of coupling noise.

SUMMARY OF THE INVENTION

The invention relates to reducing the adverse impacts of coupling noise in integrated circuits with diagonal signal lines. In one embodiment, an IC comprises first and second adjacent diagonal signal line pairs. In one embodiment, the signal line pairs comprise bitline pairs. The first bitline line pair comprises m twists, where m is a whole number $\geq 1$. The second bitline pair comprises n twists, where n is a whole number not equal to m. The twists switch the bitline paths of the bitlines within the bitline pair. Providing the bitline pairs with twists transform coupling noise with neighboring bitline pairs into common mode noise. Common mode noise is desirable as it does not reduce the signal margin of the differential signal.

DETAILED DESCRIPTION OF THE INVENTION

The invention relates to reducing the adverse impact of coupling noise in signal lines. In one embodiment, the invention reduces the impact of coupling noise in bitlines of ICs such as, for example, random access memories (RAMS) including dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of memory ICs or logic ICs.

Figure 3:
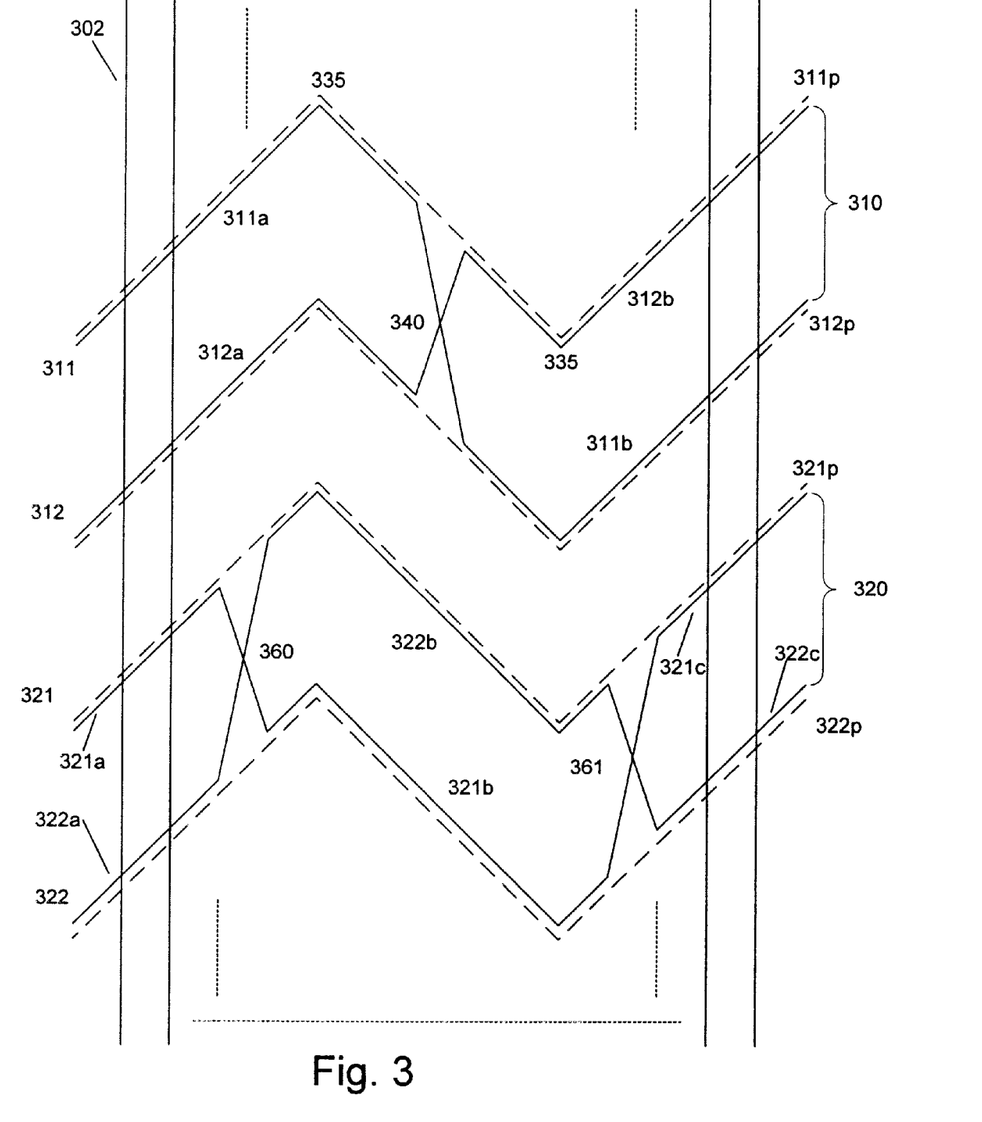
FIGS. 3–8 show various embodiments of the invention for reducing the impact of coupling noise in diagonal signal lines.

FIG. 3 shows an embodiment of the invention, which includes first and second adjacent signal line pairs 310 and 320. The signal line pairs comprise first and second signal lines (311 and 312; 321 and 322). The signal lines can be, for example, differential signal lines, internal differential data lines, differential clock lines, or other types of differential signal lines in an IC.

In one embodiment, the signal line pairs comprise bitline pairs of an array. The first bitline pair 310 includes first and second bitlines 311 and 312 and the second bitline pair 320 includes first and second bitlines 321 and 322. The bitlines are arranged diagonally with respect to wordlines 302, forming a diagonal bitline architecture. The bitlines comprises directional changes that change the angle of the bitlines with respect to the wordlines. Typically, angles of the bitlines before and after a directional change are complementary angles. One bitline of the bitline pair is referred to as the bitline and the other is referred to as the reference bitline. The bitlines of the first bitline pair are located in bitline paths 311p and 312p (dotted lines), and the bitlines of the second bitline pair are located in bitline paths 321p and 322p.

In accordance with one embodiment of the invention, at least one of the adjacent bitline pairs comprises m twists, where m is a whole number $\geq 1$; the other bitline pair comprises n twists, where n is a whole number $\neq m$. The twists are employed to switch the bitline paths of the bitlines within the bitline pair. The twists separate the bitlines into a plurality of bitline segments (m+1 or n+1 if n>0). As such, adjacent bitline paths of different bitline pairs contain a different number of bitline segments.

The total lengths of the first and second bitline segments in a bitline path are about equal. The twist or twists are placed such that the bitlines from one bitline pair and the bitlines from the other bitline pair along adjacent bitline paths impact each other in the same manner, creating common mode noise between the bitline pairs. Depending on the number twists selected, the twists may be located at the region of the directional change or in a straight portion of the bitlines.

In an illustrative embodiment, the first bitline pair comprises a twist 340 (m=1) and the second bitline pair comprises twists 360 and 361 (n=2). Twist 340 divides the bitlines of the first bitline pair into bitline segments 311a–b and 312a–b, each having a length equal to substantially about ½ the length of a bitline. The second bitline pair is divided into segments 321a–c and 322a–c by twists 360 and 361. Segments 321a, 321c, 322a, and 322c are each about substantially ¼ the length of a bitline while segments 321b and 322b are each about substantially ½ the length of a bitline. The total lengths of the first and second bitline segments along a bitline path are about the same. The twist or twists are placed such that the bitlines from one bitline pair and the bitlines from the other bitline pair along adjacent bitline paths impact each other in the same manner, transforming coupling noise into common mode noise.

The first and second bitline pairs can serve as building blocks to form the array. The values for m and n do not necessary have to be the same for all of the building blocks as long as adjacent bitline pairs do not have the same number of twists. The twists adjacent bitline pairs should not be in the same location.

Figure 4:
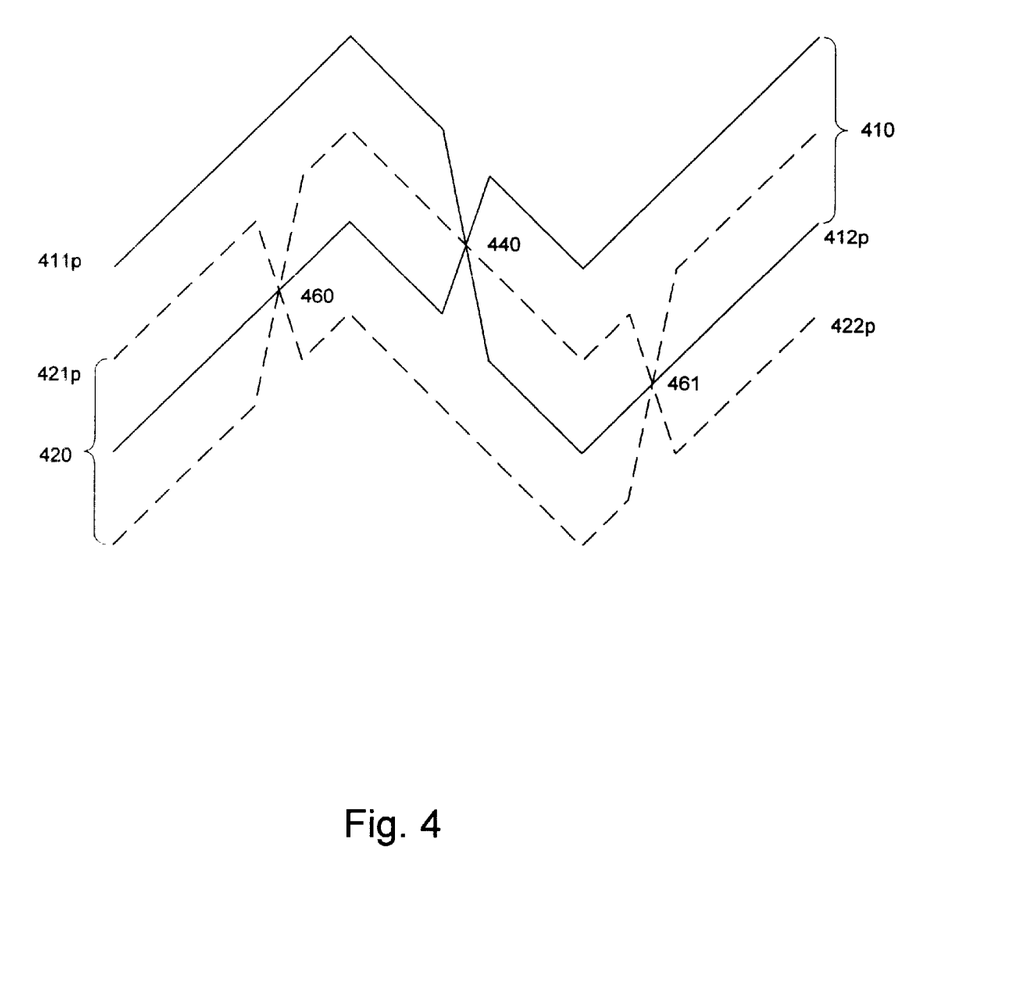

FIG. 4 shows another embodiment of the invention for reducing the adverse impact of coupling noise in accordance with one embodiment of the invention. As shown, first and second diagonal bitline pairs 410 and 420 are interleaved together. By interleaving the bitline pairs together, the bitline paths of a bitline pair are not adjacent to each other but to a bitline path from another bitline pair. For example, bitline paths 411p and 412p of the first bitline pair are adjacent to bitline path 421p. In accordance with one embodiment of the invention, the first bitline pair comprises m twists, where m is a whole number $\geq 1$ which is $\neq n$, and the second bitline pair comprises n twists, where n is a whole number $\neq m$. As shown, the first bitline pair comprises a twist 440 (m=1) and the second bitline pair comprises twists 460 and 461 (n=2). The twists separate the bitlines into a plurality of segments. The total lengths of the first and second bitline segments in a bitline path are about equal. The twists are placed along the bitline pairs to transform coupling noise between the bitline pairs into common mode noise.

The first and second interleaved bitline pairs can serve as buildings to form a memory array. The values for m and n do not necessary have to be the same for all the building blocks. Interleaving more than two bitline pairs together is also be useful.

Figure 5:
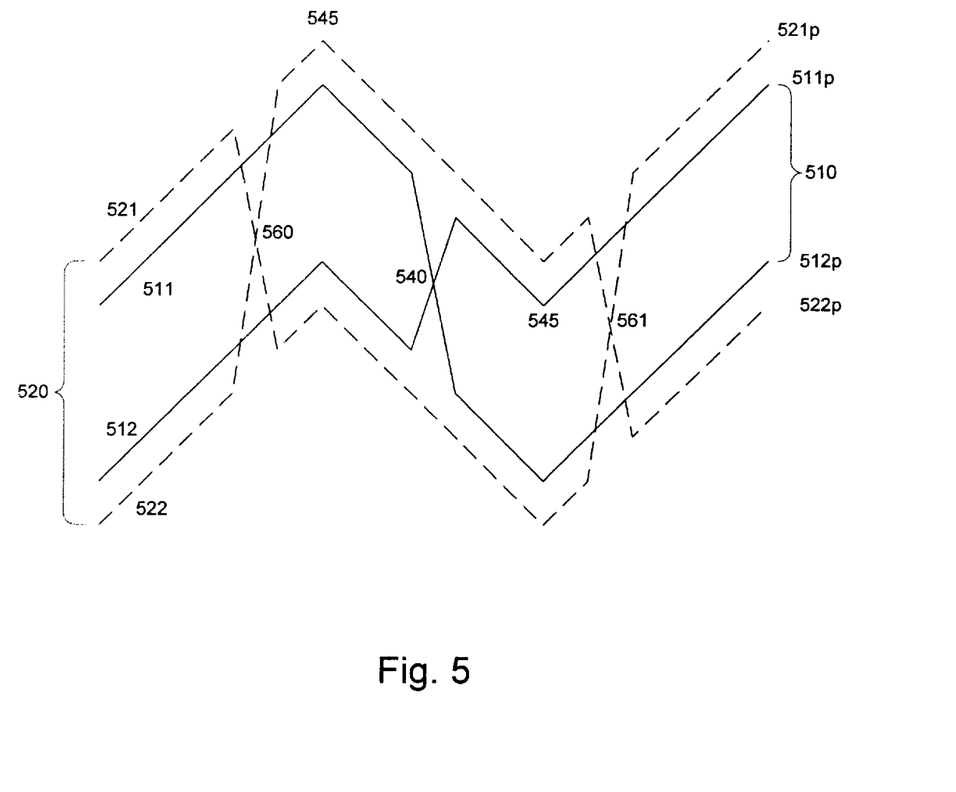

FIG. 5 shows an embodiment of the invention for reducing the impact of coupling noise. As shown, a first bitline pair 510 in a first bitline level and a second bitline pair 520 in a second bitline level are provided. A bitline pair comprises first and second bitlines (511 and 512 or 521 and 522). The bitlines are located along bitline paths (identified by the letter p after a reference number). The different bitline levels can be realized in metal 0 (M0) and metal 1 (M1) of an IC. The bitline paths of the bitline pairs are configured diagonally with respect to wordlines. As shown, the diagonal bitline paths comprise directional changes 545, changing the angle of the bitline paths with respect to the wordlines.

The first bitline pair on the first bitline level is adjacent to the second bitline pair on the second level. The bitline paths of one bitline pair can be substantially aligned with the bitline paths of the other bitline pair. Offsetting the bitline paths of the different bitline pairs can also be useful, for example, to facilitate coupling of memory cells to the bitlines in the upper bitline level.

In accordance with one embodiment of the invention, the first bitline pair comprises m twists, where m is a whole number $\geq 1$, and the second bitline pair comprises n twists, where n is a whole number $\neq m$. In one embodiment, the first bitline pair comprises a twist 540 (m=1) and the second bitline pair comprises twists 560 and 561 (n=2). The twists separate the bitlines into a plurality of segments (m+1 segments for bitlines of the first bitline pair and n+1 segments, if n $\geq 1$, for bitlines of the second bitline pair). The total lengths of the first and second bitline segments in a bitline path are about equal. The twists are placed in the bitline pair to transform coupling noise between adjacent bitline pairs on different bitline level into common mode noise to avoid degradation in the signal margin.

Figure 6:
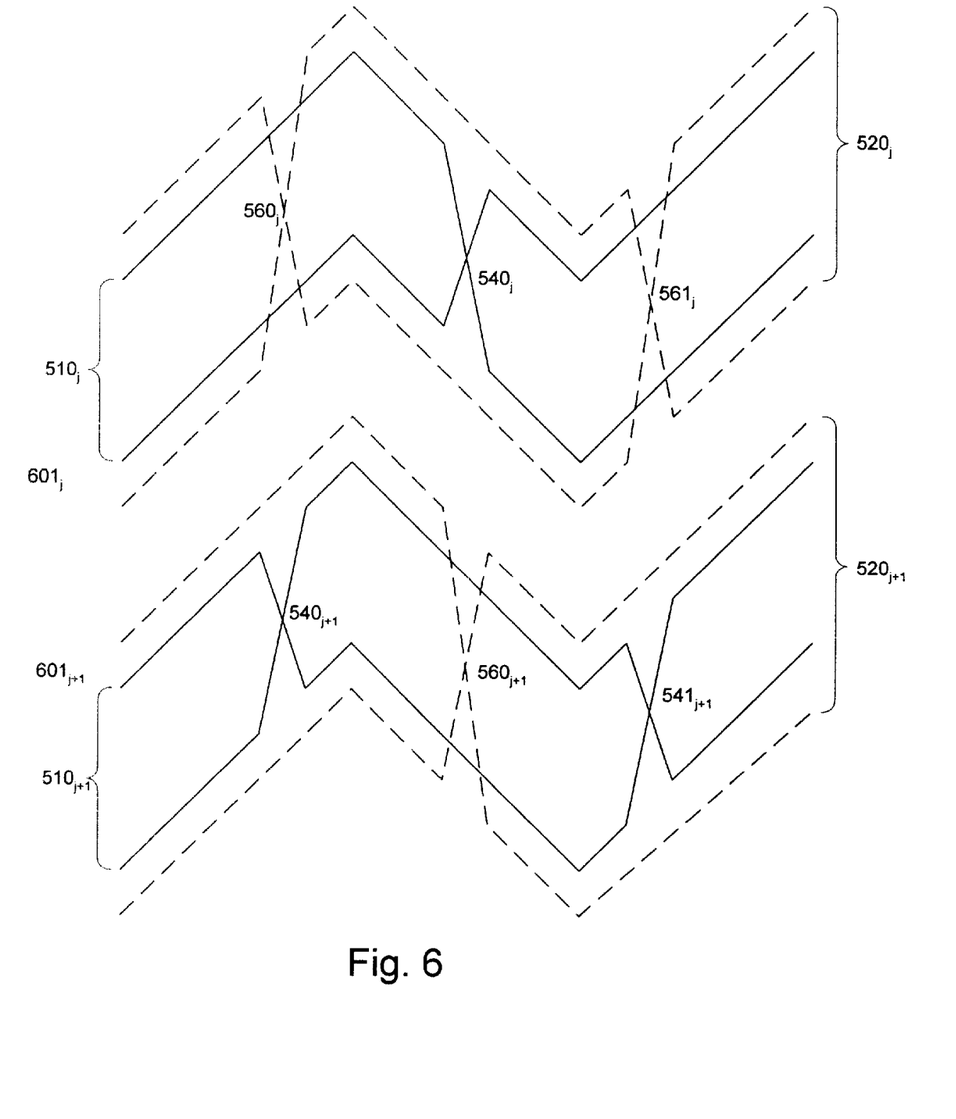
Figure 7:
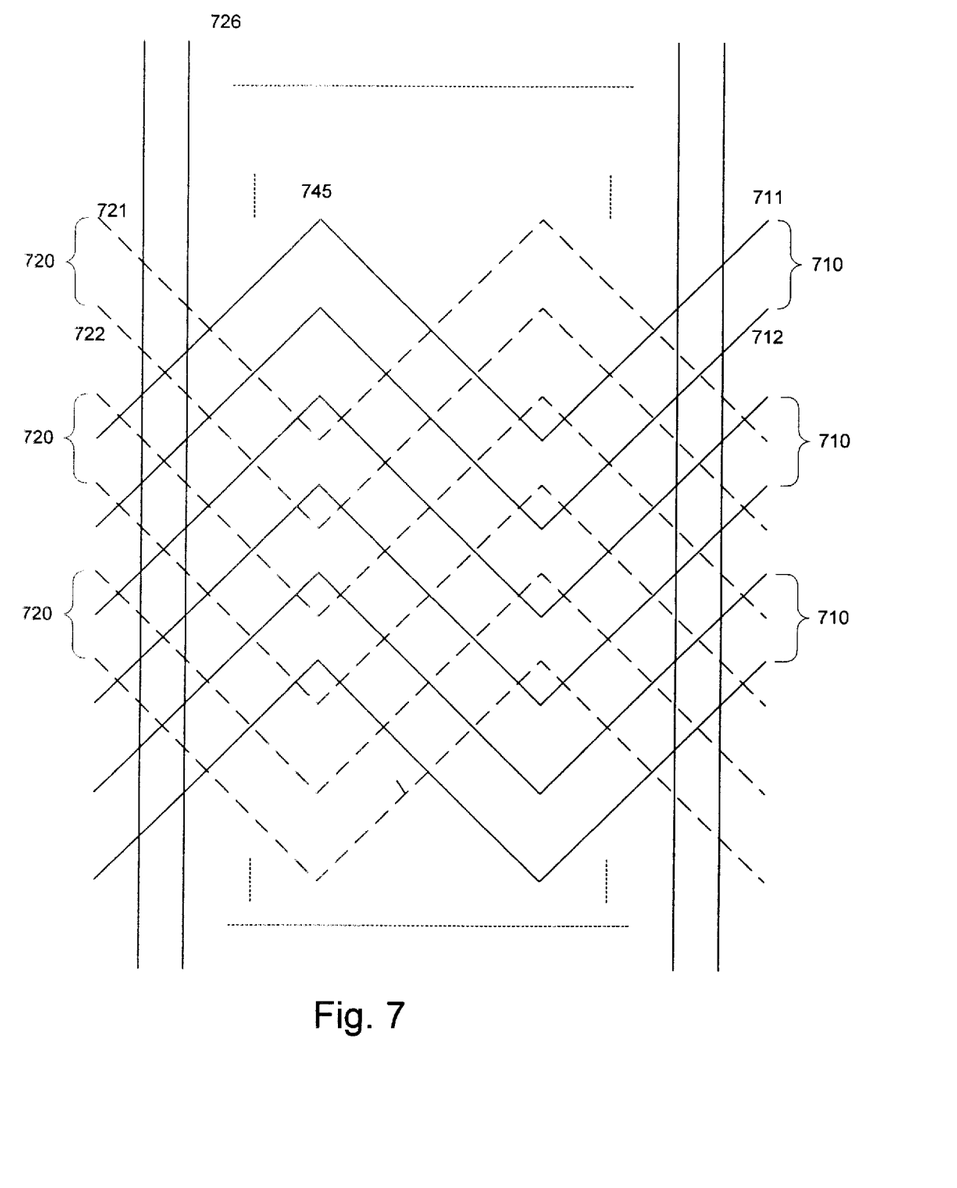

The first and second bitline pairs on different bitline levels can serve as building blocks to form an array. FIG. 6 shows an array with diagonal bitlines formed from building blocks 601. In accordance with one embodiment of the invention, one bitline pair of the building blocks is provided with m twists, where m is a whole number $\geq 1$, and the other bitline pair comprises n twists, where n is a whole number $\neq m$. The values of m and n are also not equal to the number of twists in adjacent bitline pairs on the same bitline level.

In one embodiment, the constraints of m and n in adjacent building blocks are assigned to the other bitline pair on a different bitline level. For example, a building block 601$_j$ comprises a first bitline pair 510$_j$ on a first bitline level and a second bitline pair 520$_j$ on a second bitline level. The first bitline pair comprises m twists, where is a whole number $\geq 1$, and the second bitline pair $520_j$ comprises n twists, where n is a whole number $\neq$m. As shown, the first bitline pair comprises a twist $540_j$ (m=1) and the second bitline pair comprises twists $560_j$ and $561_j$ (n=2). In an adjacent building block $601_{j+1}$, the constraints of m (whole number $\geq 1$) are assigned to the second bitline pair in the second bitline level while the constraints of n (whole number $\neq 0$) are assigned to the first bitline pair $510_{j+1}$ in the first bitline level. As shown, the first bitline pair comprises twists $540_{j+1}$ and $541_{j+1}$ (n=2) and the second bitline pair comprises $560_{j+1}$ (m=1) in adjacent building block $601_{j+1}$. The values of m and n do not need to be the same in the building blocks of the array, as long as adjacent bitline pairs on the same level do not have the same number of twists. Such a configuration reduces the impact of coupling noise between bitline pairs on different bitline levels and well as on the same bitline level.

In another embodiment, bitline pairs from adjacent building blocks can be interleaved together to reduce the impact of coupling noise. When building blocks are interleaved, bitline paths of a bitline pair are not adjacent to each other but to bitline paths of another bitline pair. Interleaving bitline pairs from more than two building blocks is also useful.

The array can be implemented with different types of building blocks. For example, some of the building blocks can be interleaved while others are not. Also, providing some building blocks that comprise vertical-horizontal twists along with building blocks in accordance with various embodiments of the invention is also useful. Vertical-horizontal twists are described in concurrently filed U.S. patent application Ser. No. 09/406,890, entitled "REDUCING IMPACT OF COUPLING NOISE IN MULTI-LEVEL BITLINE ARCHITECTURE", which is herein incorporated by reference for all purposes.

In accordance with one embodiment of the invention, the first bitline pairs and the second bitline pairs are disposed at an angle with respect to each other. In one embodiment, the angles of the first bitline pairs are negative with respect to the angles of the second bitline pairs. Such a configuration causes the bitlines from the different level to overlap each other, resulting in a reduction in coupling noise between the bitlines of the different bitline levels.

Figure 8:
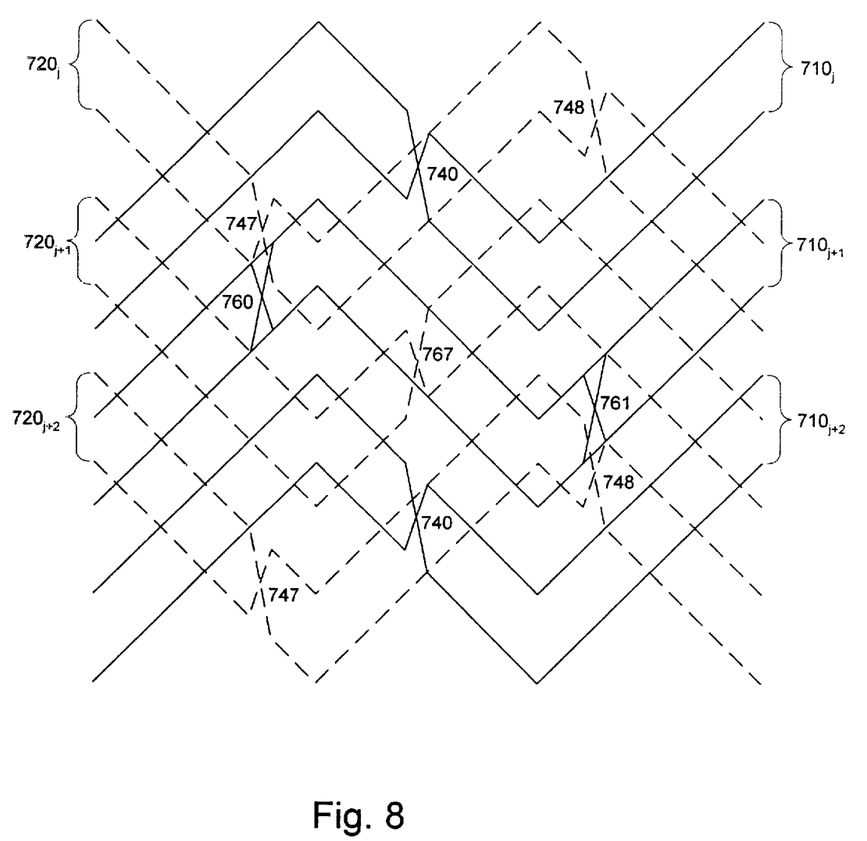

In another embodiment, as shown in FIG. 8, twists are provided in the bitline pairs to reduce the impact of coupling noise between bitlines in the same bitline level. In one embodiment, every other bitline pair on a bitline level comprises m twists, where m is a whole number $\geq 1$, and bitline pairs adjacent to the every other bitline pair comprise n twists, where n is a whole number $\neq$m (including 0). For example, in the first bitline level, every other bitline pair $710_j$ or $710_{j+2}$ comprises twist $740$ (m=1) and adjacent bitline pair $710_{j+1}$ comprises twists $760$ and $761$ (n=2). In the second bitline level, every other bitline pair $720_j$ or $720_{j+2}$ comprise twists $747$ and $748$ (m=2) while adjacent bitline pair comprises twists $767$ (n=1). Alternatively, twists are only provided for bitline pairs in either the first or second level. Also, it is not necessary that the values for m and n need to be the same for all the every other and adjacent bitline pairs in the array.

In another embodiment the bitline pairs on the same level can be interleaved, as described in FIG. 4 to reduce the impact of coupling noise. Interleaving the bitline pairs results in bitlines within a bitline pair being adjacent to a bitline from another bitline pair.

While the invention has been particularly shown and described with reference to various embodiments, it will be recognized by those skilled in the art that modifications and changes may be made to the present invention without departing from the spirit and scope thereof. Merely by way of example, the invention can be used to reduce the impact of coupling noise in any type of differential signal lines. The scope of the invention should therefore be determined not with reference to the above description but with reference to the appended claims along with their full scope of equivalents.

What is claimed is:

1. An integrated circuit comprising:

a plurality of signal line pairs, wherein each pair occupies a diagonal signal path with directional changes;

a plurality of twists in each of the signal line pairs, wherein adjacent signal line pairs have an unequal number of twists such that a first signal line pair has m twists, where m is a whole number $\geq 1$ m, and an adjacent second signal line pair has n twists, where n is a whole number $\neq$m, the twists switch diagonal signal paths of a first and a second signal line of each signal pair respectively.

2. The integrated circuit of claim 1 wherein the m twists separates the first and second signal lines of the first signal line pair into m+1 segments.

3. The integrated circuit of claim 2 wherein a total length of the first signal line segments and a total length of the second signal line segments along a diagonal signal line path are about equal.

4. The integrated circuit of claim 3 wherein m=1.

5. The integrated circuit of claim 1 wherein the signal pairs comprises bitline pairs with first and second bitlines occupying first and second diagonal bitline paths.

6. The integrated circuit of claim 5 wherein the m twists separates the first and second bitlines of the first bitline pair into m+1 segments.

7. The integrated circuit of claim 6 wherein a total length of the first bitline segments and a total length of the second bitline segments along a diagonal bitline path are about equal.

8. The integrated circuit of claim 7 wherein m=1.

9. The integrated circuit of claim 1 wherein the first signal line pair is on a first signal level and the second signal line pair is on a second signal level.

10. The integrated circuit of claim 9 wherein the m twists separates the first and second signal lines of the first signal line pair into m+1 segments.

11. The integrated circuit of claim 10 wherein a total length of the first signal line segments and a total length of the second signal line segments along a diagonal signal line path are about equal.

12. The integrated circuit of claim 1 wherein m=1.

13. The integrated circuit of claim 9 wherein the signal pairs comprises bitline pairs on first and second bitline level with first and second bitlines occupying first and second diagonal bitline paths.

14. The integrated circuit of claim 13 wherein the m twists separates the first and second bitlines of the first bitline pair into m+1 segments.

15. The integrated circuit of claim 14 wherein a total length of the first bitline segments and a total length of the second bitline segments along a diagonal bitline path are about equal.

16. The integrated circuit of claim 1, wherein a total length of the first signal line segments and a total length of the second signal line segments along a diagonal signal line path of the second signal line pair are about equal.

17. The integrated circuit of claim 16 wherein a total length of the first signal line segments and a total length of the second signal line segments along a diagonal signal line path of the second signal line pair are about equal.

18. The integrated circuit of claim 17 wherein the m twists and n twists are located along the first and second signal line pairs to transform coupling noise between the signal line pairs into common mode noise.

19. The integrated circuit of claim 1, wherein n equals 2 or 3, the n twists separate the first and second signal lines of the second signal line pair into n+1 segments.

20. The integrated circuit of claim 19 wherein a total length of the first signal line segments and a total length of the second signal line segments along a diagonal signal line path of the second signal line pair are about equal.

21. The integrated circuit of claim 20 wherein the m twists and n twists are located along the first and second signal line pairs to transform coupling noise between the signal line pairs into common mode noise.

* * * * *